(12) United States Patent
Holz et al.

(10) Patent No.: US 9,219,063 B2
(45) Date of Patent: Dec. 22, 2015

(54) INTEGRATED CIRCUIT ARRANGEMENT COMPRISING A FIELD EFFECT TRANSISTOR, ESPECIALLY A TUNNEL FIELD EFFECT TRANSISTOR

(71) Applicant: Infineon Technologies AG, Neubiberg (DE)

(72) Inventors: Juergen Holz, Dresden (DE); Ronald Kakoschke, Munich (DE); Thomas Nirschl, Munich (DE); Christian Pacha, Munich (DE); Klaus Schruefer, Baldham (DE); Thomas Schulz, Heverlee (BE); Doris Schmitt-Landsiedel, Ottobrunn (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 14/153,947

(22) Filed: Jan. 13, 2014

(65) Prior Publication Data

US 2014/0124827 A1   May 8, 2014

Related U.S. Application Data

(62) Division of application No. 11/816,822, filed as application No. PCT/EP2005/056659 on Dec. 9, 2005, now Pat. No. 8,629,500.

(30) Foreign Application Priority Data

Feb. 21, 2005   (DE) .................... 10 2005 007 822

(51) Int. Cl.
*H01L 29/78* (2006.01)
*H01L 27/06* (2006.01)
(Continued)

(52) U.S. Cl.
CPC .... *H01L 27/0886* (2013.01); *H01L 21/823418* (2013.01); *H01L 21/823462* (2013.01);
(Continued)

(58) Field of Classification Search
CPC ............ H01L 29/7391; H01L 29/7392; H01L 29/66356
USPC ........................... 438/237; 257/E29.195, 288
See application file for complete search history.

(56) References Cited

U.S. PATENT DOCUMENTS

| 4,161,039 A | 7/1979 | Rossler |
| 5,153,144 A | 10/1992 | Komori et al. |

(Continued)

FOREIGN PATENT DOCUMENTS

| DE | 10260334 A1 | 7/2004 |
| DE | 102004010673 A1 * | 11/2005 |

(Continued)

OTHER PUBLICATIONS

Wolf, S., "Silicon Processing for the VLSI era," vol. 2—Process Integration, California: Lattice Press, 1990.

*Primary Examiner* — Victor A Mandala
*Assistant Examiner* — Regan J Rundio
(74) *Attorney, Agent, or Firm* — Slater & Matsil, L.L.P.

(57) ABSTRACT

Integrated circuit arrangement comprising a field effect transistor, especially a tunnel field effect transistor. An explanation is given of, inter alia, tunnel field effect transistors having a thicker gate dielectric in comparison with other transistors on the same integrated circuit arrangement. As an alternative or in addition, said tunnel field effect transistors have gate regions at mutually remote sides of a channel forming region or an interface between the connection regions of the tunnel field effect transistor.

20 Claims, 4 Drawing Sheets

Figure 1:
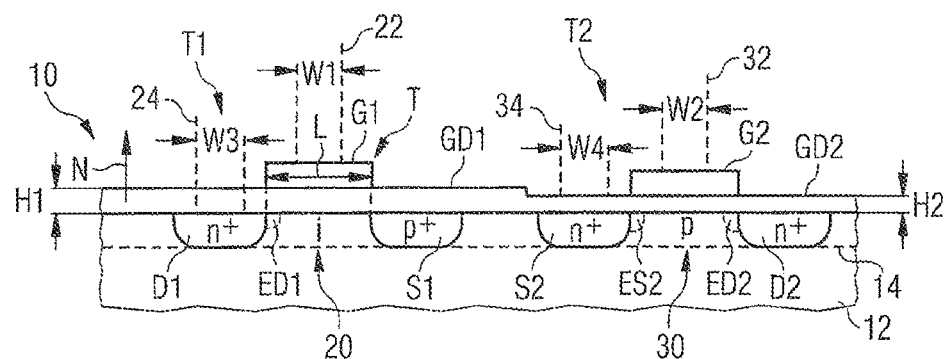

(51) Int. Cl.
*H01L 27/088* (2006.01)
*H01L 29/739* (2006.01)
*H01L 29/66* (2006.01)
*H01L 21/8234* (2006.01)
*H01L 27/105* (2006.01)
*H01L 21/336* (2006.01)
*H01L 27/12* (2006.01)

(52) U.S. Cl.
CPC ...... *H01L27/1052* (2013.01); *H01L 29/66795* (2013.01); *H01L 29/7391* (2013.01); *H01L 29/7392* (2013.01); *H01L 29/78* (2013.01); *H01L 29/7856* (2013.01); *H01L 27/1203* (2013.01); *H01L 29/785* (2013.01); *H01L 29/7854* (2013.01)

(56) References Cited

U.S. PATENT DOCUMENTS

| | | | |
|---|---|---|---|
| 5,936,265 A | 8/1999 | Koga | |
| 6,143,607 A | 11/2000 | Chi | |
| 6,329,247 B1 * | 12/2001 | Ito | 438/264 |
| 6,413,802 B1 | 7/2002 | Hu et al. | |
| 6,642,090 B1 | 11/2003 | Fried et al. | |
| 6,657,240 B1 * | 12/2003 | Chi | 257/162 |
| 7,045,830 B1 * | 5/2006 | Cai et al. | 257/139 |
| 7,355,218 B2 | 4/2008 | Schnabel et al. | |
| 2003/0178670 A1 | 9/2003 | Fried et al. | |
| 2005/0017240 A1 | 1/2005 | Fazan | |
| 2005/0035410 A1 | 2/2005 | Yeo et al. | |
| 2006/0001058 A1 | 1/2006 | Dreeskornfeld et al. | |
| 2006/0033128 A1 * | 2/2006 | Chi | 257/279 |
| 2006/0033145 A1 | 2/2006 | Kakoschke et al. | |
| 2006/0113612 A1 * | 6/2006 | Gopalakrishnan et al. | 257/392 |
| 2008/0068895 A1 * | 3/2008 | Kakoschke et al. | 365/185.23 |

FOREIGN PATENT DOCUMENTS

| | | |
|---|---|---|
| EP | 0526897 A2 | 2/1993 |
| EP | 1482562 A2 | 12/2004 |
| JP | 529616 | 2/1993 |
| JP | 05041520 A | 2/1993 |
| JP | 9162394 | 6/1997 |
| JP | 1098371 | 4/1998 |
| JP | 10098371 A | 4/1998 |
| WO | 04001801 A2 | 12/2003 |
| WO | 2004051749 A1 | 6/2004 |

\* cited by examiner

INTEGRATED CIRCUIT ARRANGEMENT COMPRISING A FIELD EFFECT TRANSISTOR, ESPECIALLY A TUNNEL FIELD EFFECT TRANSISTOR

This application is a divisional of U.S. Pat. No. 8,629,500, U.S. application Ser. No. 11/816,822, filed on Jun. 12, 2008, which is a National Stage Entry of PCT Application PCT/EP05/56659 filed on Dec. 9, 2005, which claims priority to German Patent Application 10 2005 007 822.2 filed on Feb. 21, 2005, which are all incorporated herein by reference.

The first FET therefore has two connection regions which are doped in accordance with mutually different doping types, i.e. n-doped and p-doped. The first FET is preferably operated in the reverse direction, such that a tunnel field effect transistor arises. However, operation in the forward direction is also possible. In the tunnel operating mode, the first connection region is the source region or the tunnel connection region. In the tunnel operating mode, the other connection region of the first FET is the drain region. Hereinafter, field effect transistors having drain and source regions which are doped in accordance with mutually different doping types, irrespective of the mode of operation, are referred to as tunnel field effect transistors.

The undoped or the so-called intrinsically conducting (intrinsic) adjacent region has a doping of, for example, less than $10^{13}$ or $10^{14}$ doping atoms per $cm^3$ (cubic centimeter), that is to say a doping which arises e.g. as a result of unavoidable impurities during the production of high-purity semiconductor materials. In order to enable good tunneling, the tunnel connection region (source) should have a steep doping gradient and a high dopant concentration, for example a maximum dopant concentration of greater than $10^{20}$ or greater than $10^{21}$ dopant atoms per $cm^3$. A lower dopant concentration is possible, however.

In one type of first FETs, the adjacent region is formed by the further connection region of the first FET, the further connection region being doped in accordance with the second doping type. The dopant concentration in the further connection region is for example greater than $10^{20}$ dopant atoms per $cm^3$.

In another type of first FETs, the further connection region of the first FET adjoins the adjacent region, such that the adjacent region forms a channel forming region. The further connection region is doped in accordance with the second doping type, for example with a maximum dopant concentration of greater than $10^{20}$ dopant atoms per $cm^3$. In this case, the adjacent region is undoped or more lightly doped, for example by at least one power of ten, in comparison with the further connection region. In both cases, the current of the device is controlled by the voltage applied to the controlling region.

It is an object of the invention to specify a simply constructed integrated circuit arrangement comprising tunnel FETs, the electrical properties of the circuit arrangement or the electrical properties of the tunnel FETs being improved, in particular with regard to the leakage current, the power loss and the overlap capacitance, and in particular by virtue of a smaller chip area required.

This object is achieved by means of a circuit arrangement comprising the features mentioned in patent claim 1. Developments are specified in the subclaims.

In particular, the object specified above is achieved by virtue of the fact that the integrated circuit arrangement contains, alongside the first or the tunnel FET, a further FET, in which the connection regions are doped in accordance with the same doping type, that is to say for example in accordance with the first doping type or in accordance with the second doping type. The connection regions (source and drain) of the further field effect transistor are referred to hereinafter as third connection region and fourth connection region, respectively. A channel forming region is arranged between the connection regions of the further FET, said channel forming region being undoped or doped in accordance with a different doping type than the third connection region. Moreover, the further FET contains a further control region or a further gate and also an electrically insulating further dielectric region or a gate dielectric between the further gate and the channel forming region. The gate dielectric region of the tunnel FET has an equivalent silicon dioxide thickness that is at least 50 percent or at least 100 percent greater than the equivalent silicon dioxide thickness of the further gate dielectric region. The equivalent silicon dioxide thickness (EOT—equivalent oxide thickness) is calculated in accordance with the following formula:

$$t_{equ} = \in_r(SiO_2)/\in_r(x) t_x,$$

where $t_{equ}$ is the equivalent silicon dioxide thickness, $\in_r(SiO2)$ is the relative permittivity of silicon dioxide, $\in_r(x)$ is the relative permittivity of the material used as gate dielectric, and $t_x$ is the thickness of the material used as gate dielectric. The formula for the equivalent silicon dioxide thickness can also be applied to layer stacks, for each layer the equivalent silicon dioxide layer thickness being calculated and $t_{equ}$ subsequently being summed over the calculated thicknesses. In particular, the formula can also be applied to silicon dioxide, the equivalent thickness being equal to the physical thickness.

The development is based on the consideration that tunnel FETs, on account of the reverse direction operating mode, have a smaller leakage current in comparison with conventional FETs comprising drain and source regions having the same doping type. However, said leakage current can be reduced even further if the equivalent silicon dioxide thickness of the gate dielectric of the tunnel FET is increased. On account of the outstanding short channel properties of the tunnel FET, there is leeway in the choice of the thickness of the gate dielectric, in which case, despite an increased dielectric thickness, the control effect on the tunnel junction is still great enough that a transistor having outstanding or very good electrical properties arises, in particular with regard to the switch-off current, the switch-on current, the subthreshold voltage rise, etc. Since FETs comprising drain and source regions having the same doping type do not exhibit such good short channel properties, however, there is no leeway there for increasing the equivalent silicon dioxide thickness, so that a smaller equivalent silicon dioxide thickness is used there than in the tunnel FET. For comparison, reference is made for example to FETs having gate lengths identical to one another or having gate lengths which differ only by −20 percent to +20 percent or by −10 percent to +10 percent relative to the gate length of the tunnel FET. An upper limit for increasing the equivalent silicon dioxide thickness of the tunnel FET is for example 300 percent or 200 percent of the equivalent silicon dioxide thickness of the FET comprising drain and source regions having the same doping type.

The larger equivalent silicon dioxide thickness also reduces parasitic capacitances, for example between the gate and the first or tunnel connection region, with the result that the electrical properties of the tunnel FET are improved further. On account of the larger equivalent silicon dioxide thickness, it is also possible, when reducing the smallest minimal dimensions of the tunnel FET, to delay the transition to dielectrics having higher dielectric constants. Silicon dioxide can thus continue to be used. As a result, the process costs are low.

On account of the thicker dielectric of the tunnel FET, the gate leakage current is reduced, with the result that the power consumption of the tunnel FETs is reduced in comparison with tunnel FETs without an additionally thickened gate dielectric and also in comparison with FETs having a thin gate dielectric and without a tunnel operating mode.

In one development of the invention, the tunnel FET is arranged in a memory cell array of a memory unit containing a multiplicity of memory cells, e.g. millions of memory cells or more than a billion ($10^9$) memory cells. The memory unit is for example an SRAM (Static Random Access Memory) or a DRAM (Dynamic Random Access Memory). The further FET is arranged in a word line or bit line decoder of the memory unit. As an alternative, the further FET is situated in an amplifier circuit connected to a bit line, said amplifier circuit also being referred to as sense amplifier. In this development, the reduction of the power consumption of the integrated circuit arrangement is particularly high on account of the multiplicity of tunnel FETs. For driving or reading the memory cell array, FETs comprising drain and source regions having the same doping type are used which, on account of the absence of a so-called body tie, enable a turn-off without discharge of the substrate and hence with small capacitances. The number of peripheral transistors is small in comparison with the number of transistors in the memory cell array, so that an increased leakage current is acceptable here.

In an alternative development, the tunnel FET and the further FET are arranged in a logic basic circuit, in particular in a NAND, NOR, AND, OR circuit or an inverter circuit. The tunnel FETs afford the possibility, in particular, of achieving a contact-connection of the channel forming region without additional measures. In particular, those FETs of the logic basic circuits which are switched on in the operating state of the logic basic circuit that is assumed the most frequently are formed as tunnel FETs having a thicker gate dielectric.

In a next development, the tunnel FETs are arranged in a subcircuit of the integrated circuit arrangement which is not turned off in a standby operating mode, e.g. in a so-called wake-up circuit. The FET comprising the drain region and the source region having the same doping type is situated, by contrast, in a part of the integrated circuit arrangement which is turned off, such that larger leakage currents do not constitute a disturbance here.

In another development, the tunnel FET and the further FET are arranged in subcircuits of the integrated circuit which are arranged on the same operating potential lines. On account of the identical operating voltages at the two transistors, the gate dielectric thicknesses thereof are comparable with one another.

In a next development of the invention, the tunnel FET and the further FET are arranged in subcircuits of the integrated circuit arrangement which are operated with the same operating voltages or with mutually different operating voltages, the operating voltage for the tunnel FET lying within the range of −50 percent to 100 percent relative to the operating voltage for the further FET. This means that the two transistors are comparable with one another in particular over their operating voltage range. In accordance with the relationship specified above, the tunnel FET is in particular not a so-called high-voltage component, which is operated for example with an operating voltage of greater than 3 volts or greater than 5 volts. Moreover, the tunnel field effect transistor is in particular not an input/output component or I/O component, which is connected to an external terminal of the integrated circuit arrangement directly or only via a resistance.

In a next development, the tunnel FET and the further FET have essentially the same structure apart from the doping type of source or drain region and apart from the different gate dielectric thickness, such that as many of the following features as possible match in these two transistors: the contact area of a metallization to the tunnel connection region is identical to the contact area of a metallization to the source region or to the drain region of the further FET, the contact area of a metallization to the control region of the tunnel FET is identical to the contact area of a metallization to the control region of the further FET, spacers or electrically insulating spacer elements at the control region of the tunnel FET and at the control region of the further FET have the same form and the same materials among one another, if an SOI substrate (silicon on insulator) is not used, a well doping below the tunnel FET is equal to a well doping below the further FET, a thickness of the control regions and of the material of the control regions is identical in both transistors, and the tunnel connection region or the further connection region of the tunnel FET has the same doping profile as a connection region of the further FET.

If all of the features mentioned match, for example, then both FETs can be produced by means of the same CMOS process sequence (complementary metal oxide semiconductor), only two additional method steps having to be performed.

In a next development, both transistors are situated on the same substrate, in particular on the same monocrystalline semiconductor substrate. However, the substrate can also comprise other materials, in particular electrically insulating materials, such as e.g. silicon dioxide, quartz or ceramic. Since both FETs are arranged on the same substrate, they can also have been produced by means of identical production steps. The substrate is homogeneous in the lateral direction, such that there are in particular no interruptions caused by mechanical separating operations or by filling material between the two transistors, as would be the case for example for transistors on different substrates of a multi-chip substrate.

In another development, the connection regions of the first or tunnel FET are arranged at the same distance from the substrate at which the integrated circuit arrangement is formed, in particular from a monocrystalline semiconductor substrate or from an SOI substrate. The distance refers for example to that edge of the respective connection region which lies closest to the substrate. By way of example, the distance from a planar rear side of the substrate is measured, measurement being effected along or against the direction of the normal to the rear side. To put it another way, the arrangement of the connection regions at the same distance from the substrate brings about a lateral current flow between the two connection regions. In contrast to a transistor with a vertical current flow, the transistor with a lateral current flow requires a larger chip area, if appropriate, but this is acceptable on account of the small dimensions of the channel forming region, of less than 20 nm or less than 15 nm for example, or on account of the absence of a channel forming region, or is of virtually no consequence on account of the vertically arranged current channel. Moreover, the first insulation region and the first control region are arranged laterally with respect to the first or tunnel connection region, that is to say at a smaller distance than that edge of the first or tunnel connection region which is remote from the substrate. The lateral arrangement of the control region makes it possible to achieve small overlap capacitances with respect to the two connection regions of the first or tunnel FET.

In a next development, the connection regions are arranged at a fin composed of semiconductor material, the fin having in particular a height greater than half its width, greater than 90 percent of its width, in particular equal to its width, or greater than its width, in particular more than twice as great. The fin is not restricted to these dimensions, but rather can also have a square or trapezoidal cross section or have a height less than its width. By way of example, the width of the fin is less than 50 nm (nanometers) or even less than 10 nm. The fin projects beyond the substrate and has a cross section in the direction of the normal to the substrate and at an angle of 90° with respect to the longitudinal axis of the fin which is rectangular or trapezoidal, for example.

It is advantageous to round the corners of the fin by means of an additional thermal step, in which the semiconductor material of the fin is momentarily heated up to the melting point, e.g. by means of RTP (rapid thermal processing), or RTA (rapid thermal annealing), by means of RLA (rapid laser annealing), or by means of some other method. Thus, in the case of silicon semiconductor material, for example, heating up to a temperature of greater than 1000 degrees Celsius takes place. As an alternative, the connection regions are formed at a cylindrical semiconductor material. The semiconductor material is preferably monocrystalline; in particular, monocrystalline silicon is used. The transistor forms mentioned afford the possibility of arranging gate regions at a plurality of sides of the semiconductor material. Moreover, parasitic capacitances can be kept low in comparison with transistors with a vertical current flow.

In a next development, the first or tunnel FET contains a second control region, which is insulated from the channel forming region or from the first or tunnel connection region by an electrically insulating second dielectric region. The two dielectric regions are arranged at mutually remote sides of the channel forming region or the boundary region between first or tunnel connection region and adjacent region. In one configuration, the second dielectric region has the same equivalent silicon dioxide thickness as the first dielectric region.

This development makes it possible to combine the advantages of a multiple gate FET with the advantages of a tunnel FET. Thus, a multiple gate FET makes it possible to influence the channel forming region or the tunnel connection region better. In contrast to conventional multiple gate FETs, the tunnel FET in accordance with the development affords the possibility of choosing the gate dielectric thickness to be comparatively large, because in the tunnel FET short channel effects do not have to be eliminated by reducing the thickness of the gate dielectric. The gate leakage current is reduced on account of the larger gate dielectric thickness. A further advantage is the reduced overlap or an overlap at a greater distance of gate and channel forming region or connection region. This means that the overlap capacitances decrease and the dynamic electrical properties of the tunnel FET are particularly good. In comparison with planar tunnel FETs, the multiple gate tunnel FET has a larger channel width, such that the switch-on current rises. The substrate control on a number of sides enables the leakage current to be reduced further.

This development also affords advantages if the gate dielectric of the first or tunnel FET has the same thickness as the gate dielectric of another FET of the integrated circuit arrangement, the other FET having source and drain having the same doping type. In particular, the gate dielectric of the further field effect transistor is the thinnest gate dielectric in the integrated circuit arrangement. However, particularly low leakage currents and particularly low overlap capacitances result if the gate dielectric of the first or tunnel FET is made thicker than in other FETs of the integrated circuit arrangement. The object mentioned above is achieved through combining the working principles of the first or tunnel FET TFET with the principles of a multiple gate FET. The structure of the tunnel FET, that is to say the gate-controlled diode operated in the reverse direction, enables an extremely small leakage current and also a reduction of the channel length to values of less than 20 nm (nanometers), less than 15 nm or even less than 10 nm. On account of the reduced short channel effects, the requirements made of the thickness of the gate dielectric are reduced in comparison with standard MOS components (metal oxide semiconductor). The parasitic capacitances are indirectly proportional to the thickness of the gate dielectric, such that the overlap and channel capacitances are reduced. A gate dielectric with a large dielectric constant is not necessary, in particular not with a dielectric constant of greater than 4 or greater than 8. Simple production processes can thus be used.

The thicker gate dielectric of the tunnel FET reduces the gate leakage current, which, for its part, reduces the power consumption, in particular in comparison with a standard MOSFET. The channel length of the tunnel FET can be reduced further than the channel length of a standard MOSFET.

The multiple gate tunnel FET has an increased channel width or a plurality of channels, in particular at mutually opposite sides of a channel forming region, such that the switch-on current is increased in comparison with a planar tunnel FET. The entire substrate, that is to say the entire channel forming region, is controlled by the control region of the transistor, such that a smaller leakage current occurs in comparison with a planar tunnel FET containing a spatial diode. If the body region containing the channel forming region is very narrow, a fully depleted body region is obtained. If the body region is thicker, then a partially depleted body region arises which, however, is connected on account of the possibly identical doping type of a further connection region and body region, that is to say has a so-called body tie. Effects on account of a floating potential in the channel forming region, that is to say on account of a so-called floating body effects, are reduced on account of the two measures.

A major advantage of the tunnel FET with multiple gate in comparison with a multiple gate FET comprising source and drain regions having the same doping type is the reduction of short channel effects, which permits the gate dielectric to be produced thicker. In comparison with components in which the current flow is vertical, the parasitic capacitances in transistors with a lateral current flow are small on account of the gate-drain or gate-source overlap. Consequently, the performance or the speed of digital, and in particular also of analog, circuits is increased. High-speed analog and digital circuits can thus be produced.

In a next development, the first control region is electrically conductively connected to the second control region. In an alternative development, the two control regions are electrically insulated from one another. By way of example, one control region serves for setting a threshold voltage, while the other control region performs the function of a gate. As an alternative, a logic switching function, for example a logic OR function is realized by the use of the two control regions electrically insulated from one another.

In configurations, there are further control regions at the channel forming region or at the boundary between the tunnel connection region and adjacent region. Further logic switching functions can thus be realized in a simple manner. However, other applications, for example, multipliers, can also thus be realized in a simple manner.

Figure 2:
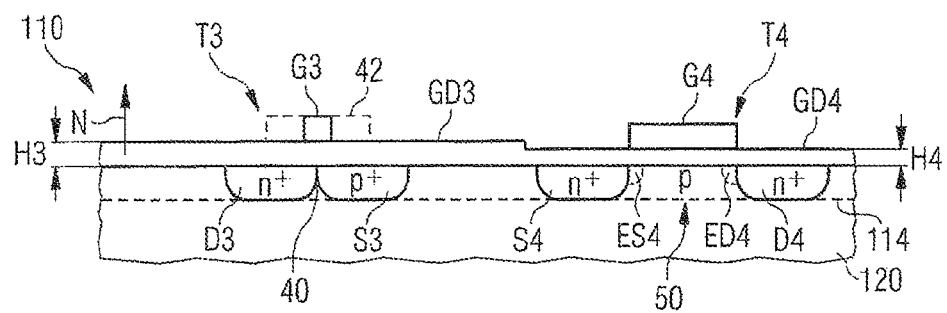
Figure 3:
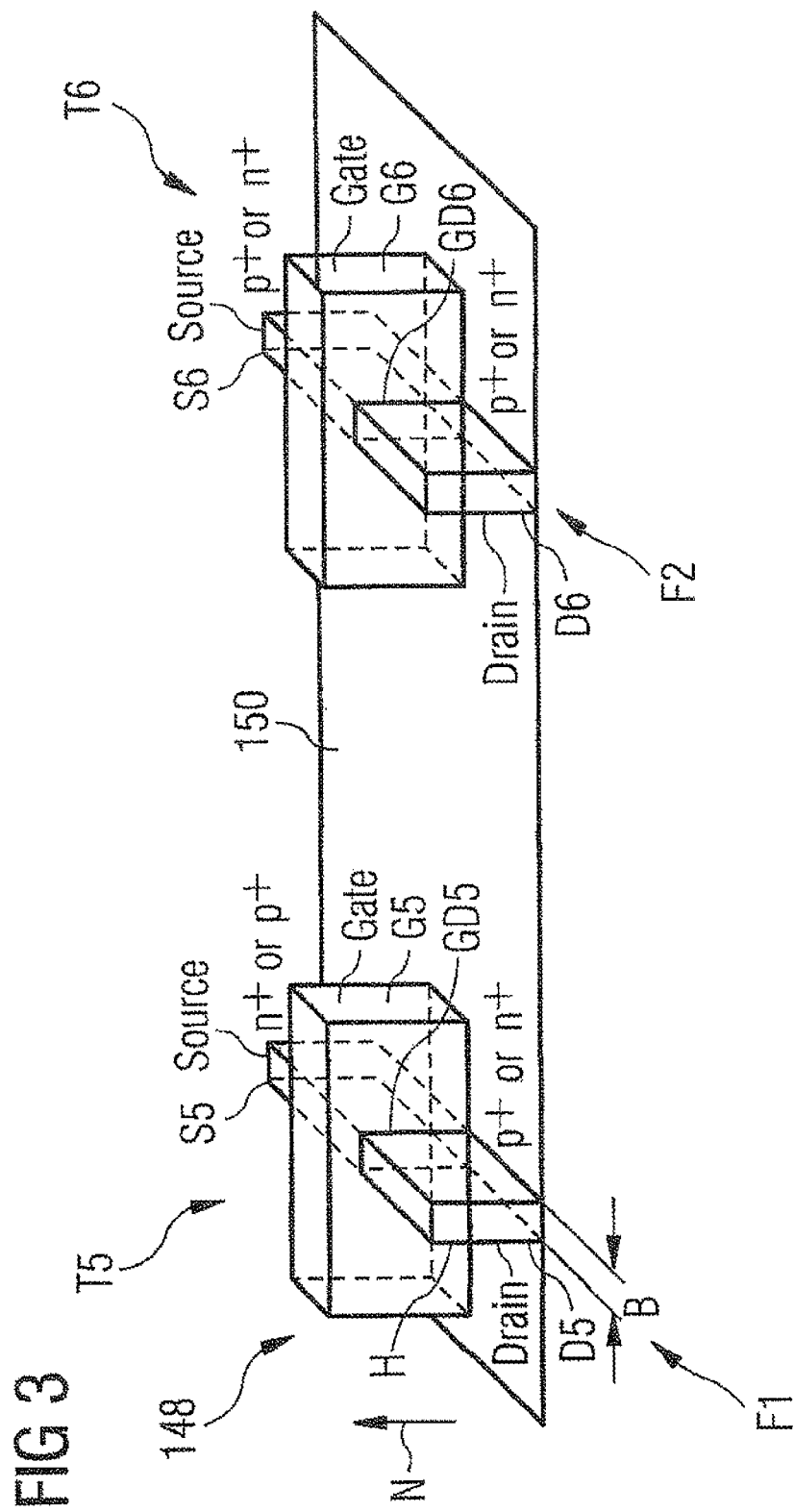
Figure 4:
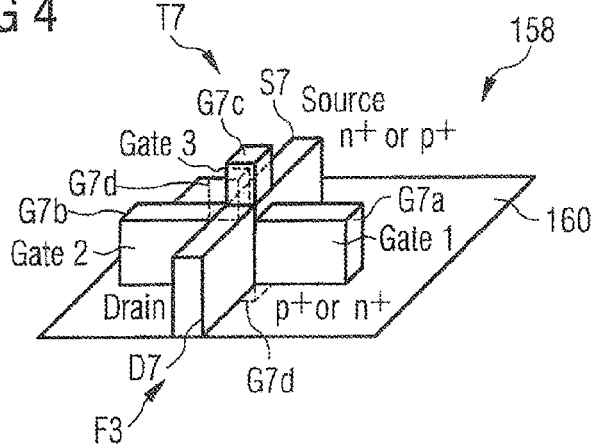
Figure 5:
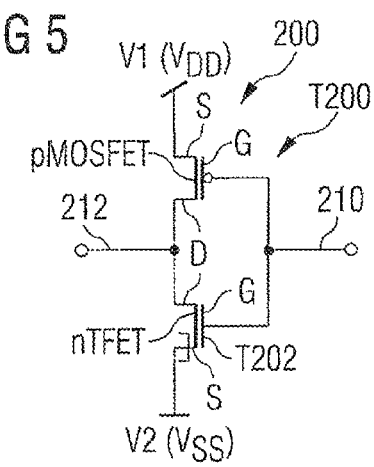
Figure 6:
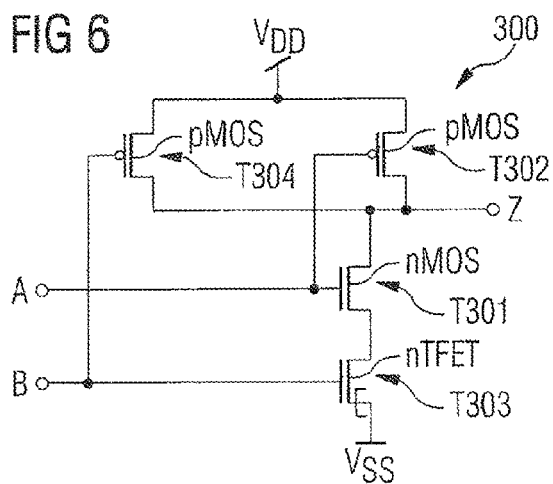
Figure 7:
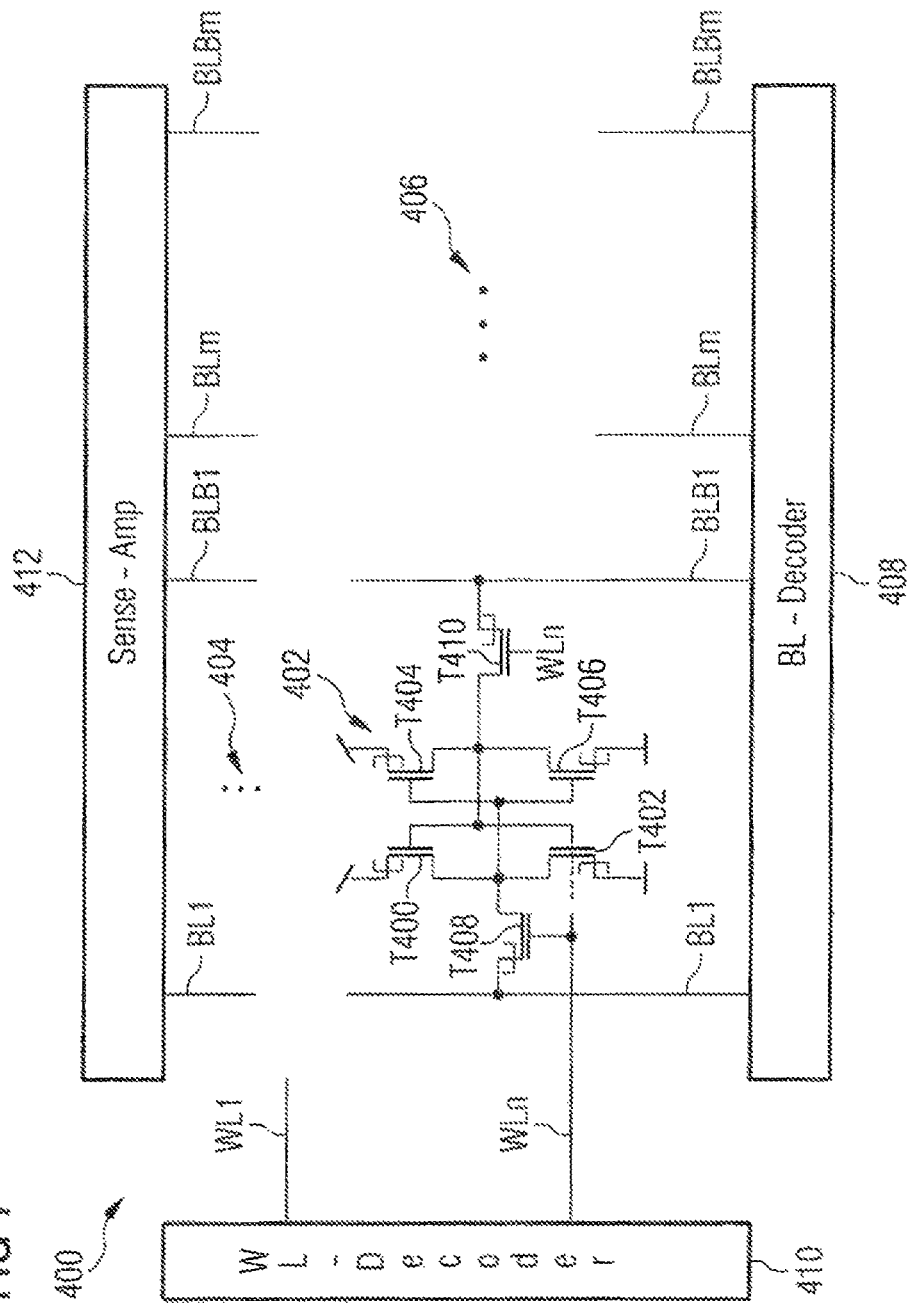

Exemplary embodiments of the invention are explained below with reference to the accompanying drawings, in which:

FIG. 1 shows a first exemplary embodiment with a planar tunnel FET containing a channel forming region, FIG. 2 shows a second exemplary embodiment with a planar tunnel FET not containing a channel forming region, FIG. 3 shows a third exemplary embodiment with a tunnel FinFET transistor, FIG. 4 shows a fourth exemplary embodiment with a tunnel FinFET transistor containing a plurality of control electrodes, FIG. 5 shows a circuit diagram of an inverter circuit, FIG. 6 shows a circuit diagram of a NAND circuit, and FIG. 7 shows a circuit diagram of an SRAM memory unit.

FIG. 1 shows a first exemplary embodiment with a planar tunnel FET T1 and with a planar FET T2, both of which are arranged on a monocrystalline semiconductor substrate 12, for example on a silicon substrate. As an alternative, the two transistors T1 and T2 are arranged on an SOI substrate 14 or on some other substrate. The two transistors T1 and T2 are part of an integrated circuit arrangement 10, during the production of which a multiplicity of process steps serve simultaneously for producing the transistor T1 and for producing the transistor T2. The transistors shown in FIGS. 1 to 3 can be arranged adjacent to one another or further away from one another, such that further components are arranged between the transistors respectively illustrated.

The transistor T1 contains a gate dielectric GD1, which is composed of silicon dioxide, for example, and has a thickness H1 of 2.2 nm, for example. At that side of the gate dielectric GD1 which faces the substrate 12, a heavily n-doped drain region D1, an intrinsic region i and a heavily p-doped source region S1 are arranged in a monocrystalline semiconductor material. The intrinsic region i is arranged between the drain region D1 and the source region S1 and is also referred to as channel forming region 20.

In the exemplary embodiment, the channel forming region 20 is covered by a gate electrode G1, e.g. composed of highly doped polycrystalline silicon or of metal, on that side of the gate dielectric GD1 which is remote from the substrate 12. The gate electrode G1 serves for controlling the operations at a tunnel junction T that arises at the boundary between channel forming region 20 and source region S1 if a sufficiently positive gate voltage is applied to the gate electrode G1.

In an alternative exemplary embodiment, the channel forming region 20 is weakly p-doped, such that the tunnel junction T is formed if an inversion channel is formed at the surface of the channel forming region 20 as a result of a positive gate voltage. In a next exemplary embodiment, the doping type in the drain region D1 and in the source region S1 is opposite to the doping types illustrated in FIG. 1. In this case, too, an intrinsically conducting channel forming region 20 or a weakly p-doped channel forming region 20 can be used.

An extension region ED1 or a so-called extension is optionally formed at the drain region D1, in particular using a spacer or spacer element at the gate electrode G1. FIG. 1 additionally illustrates a direction N of the normal to the planar substrate surface of the substrate 12. A gate length L shows the extent of the gate electrode G1 in the lateral direction. In the exemplary embodiment, the gate length L is 40 nm, for example.

Furthermore, FIG. 1 shows a gate connection 22, which is formed for example from a metallic material, for example from tungsten. A drain connection 24 serves for making contact with the drain region D1 and is composed of the same material as the gate connection 22.

The transistor T2 contains a gate dielectric GD2, which, in the exemplary embodiment, is composed of silicon dioxide and has a thickness H2 of 1.6 nm, for example. In the exemplary embodiment, the gate dielectric GD2 (or GD4 or GD6 as shown in FIG. 2 or 3) is the thinnest gate dielectric in the integrated circuit arrangement. At that side of the gate dielectric GD2 which faces the substrate 12, in the following order a heavily n-doped source region S2, a weakly p-doped channel forming region 30 and a heavily n-doped drain region D2 are formed in a silicon semiconductor material. The channel forming region 30 is covered by an electrically conductive gate electrode G2, which is composed e.g. of doped polycrystalline silicon, at that side of the gate dielectric GD2 which is remote from the substrate 12. Optionally, both at the source region S2 and at the drain region D2 it is possible to form extension regions ES2 and ED2, respectively, which have a lower dopant concentration than the source region S2 and than the drain region D2 but are doped in accordance with the same doping type as the respectively adjoining source region S2 and drain region D2. FIG. 1 illustrates a gate connection 32 for the gate G2. The gate connection 32 is formed from a metallic material, for example. Moreover, FIG. 1 illustrates a source connection 34. All the connections 22, 24, 32, 34 of the transistors T1 and T2 have identical diameters W1, W2, W3 and W4, respectively. The gate lengths of the gate electrodes G1 and G2 also match The gate dielectric thickness GD1 was therefore deliberately chosen to be greater than the gate dielectric thickness GD2. Nevertheless, both transistors T1 and T2 have very good electronic properties, the leakage current of the transistor T1, however, being particularly small.

FIG. 2 shows a second exemplary embodiment with a planar tunnel FET T3 and with a planar FET T4, which are both part of an integrated circuit arrangement 110. The integrated circuit arrangement 110 is formed on a monocrystalline semiconductor substrate 120. An SOI substrate 114 is used as an alternative. In contrast to the tunnel transistor T1, the tunnel transistor T3 does not contain a channel forming region. The transistor T3 contains a gate dielectric GD3, which, in the exemplary embodiment, is composed of silicon dioxide and has a thickness H3 of 2.2 nm. On that side of the gate dielectric GD3 which faces the substrate 120, a drain region D3 having a high n-type dopant concentration and a heavily p-doped source region S3 are arranged in a semiconductor material. The drain region D3 adjoins the source region S3 at an interface 40 lying in the direction N of the normal to the substrate 120. A gate electrode G3 is arranged at that side of the gate dielectric GD3 which is remote from the substrate 120, said gate electrode having for example the same gate length as the gate electrode G1, see dashed line 42. As an alternative, the gate electrode G3 has a shorter gate length, however, because it only has to influence the tunnel junction at the interface 40. In this case, the gate electrode G3 is patterned for example with the aid of a spacer technique.

The transistor T4 is constructed like the transistor T2, and so reference is made to the explanations above. In particular, the transistor T4 contains a gate dielectric GD4 composed of silicon dioxide, a source region S4, a channel forming region 50 and also a drain region D4. Extension regions ES4 and ED4 are optionally present. The transistor T4 contains a gate electrode G4 formed like the gate electrode G2. In other exemplary embodiments, the doping types used for the transistors T3 and T4 in the drain regions and source regions and in the channel forming region 50 are opposite to those illustrated in FIG. 2.

In the tunnel transistor T3, too, the thickness H3 of the gate dielectric GD3 is greater than the thickness H4 of the gate dielectric GD4 of the transistor T4, where H4 e.g. is again 1.6 nanometers or only 1.3 nanometers. Both transistors T3 and T4 have very good electrical properties, but a particularly small leakage current can be achieved by the targeted increase in the thickness of the gate dielectric GD3 at the transistor T3.

FIG. 3 shows a third exemplary embodiment, in which a tunnel FET T5 and a FET T6, which operates only with a channel control, are arranged in an integrated circuit arrangement 148 that has been produced on a single substrate 150. Both transistors T5 and T6 are so-called FinFET transistors, that is to say transistors which are formed at a fin F1 and at a fin F2, respectively, composed of semiconductor material. In the exemplary embodiment, the fins F1 and F2 have identical dimensions since they have been produced by means of the same processes. In particular, the widths B and also the heights H of the fins F1 and F2 are identical. In the exemplary embodiment, the width of the fin F1 is 40 nm, for example. The height H of the fin F1 is 130 nm, for example. In other exemplary embodiments, the width of the fin is less than 40 nanometers and the height is less than 130 nanometers.

The transistor T5 contains a heavily p-doped drain region D5 and a heavily n-doped source region S5. A gate electrode G5 is insulated from the fin F1 laterally and toward the top by a gate dielectric GD5.

The transistor T6 contains a heavily p-doped drain region D6 and a heavily p-doped source region S6. A gate electrode G6 is arranged laterally and above the fin F2 of the transistor T6. A gate dielectric GD6 is arranged between the gate electrode G6 and a channel forming region or an interface of drain D5 and source S5 in the fin F2. The equivalent silicon dioxide thickness of the gate dielectric GD5 is at least 50 percent greater than the equivalent silicon dioxide thickness of the gate dielectric GD6, for example at a sidewall of the fin F1 or of the fin F2. On account of the thicker gate dielectric GD5 at the tunnel FET, the leakage current of the transistor T5 can be kept particularly small without the electrical properties of the transistor T5 being adversely affected to an excessively great extent.

In other exemplary embodiments, given the same doping in the transistor T6, in the transistor T5 the drain region D5 is heavily n-doped and the source region S5 is heavily p-doped. In other exemplary embodiments, the transistor T6 is embodied as an n-channel transistor. The channel forming region of the transistor T5 is intrinsically conductive or weakly doped in accordance with the doping type with which the drain region D5 is also doped.

In another exemplary embodiment, the tunnel transistor T5 is used without there being identically configured transistors T6 which operate without a tunnel effect or which have drain regions D6 and source regions S6 of the same doping type. Independently of the thickness of the gate dielectric GD5, the transistor T5 then has the effect of increasing the controllability of the tunnel junction and of enabling a high switch-on current, in particular in comparison with planar tunnel transistors. Furthermore, the overlap capacitances between gate G5 and drain D5 or between gate G5 and source S5 are small, in particular in comparison with tunnel FETs with a vertical current flow.

FIG. 4 shows a fourth exemplary embodiment of a circuit arrangement 158 containing a tunnel FET T7. The tunnel FET T7 contains, at a fin F3, a heavily p-doped drain region D7 and also a heavily n-doped source region S7. A gate electrode G7a is arranged laterally with respect to the fin F3, said gate electrode being isolated from a channel forming region or from an interface between the drain region D7 and the source region S7 by a gate dielectric. In one exemplary embodiment, there is only the gate electrode G7a at the transistor T7. By contrast, in a further exemplary embodiment, there is also a further gate electrode G7b at that side of the channel forming region or the interface which is remote from the gate electrode G7a, said further gate electrode either being arranged electrically conductively with the gate electrode G7a or being arranged in a manner electrically insulated from the gate electrode G7a.

In a next exemplary embodiment, in addition to the gate electrodes G7a, G7b there is also another gate electrode G7c above the channel forming region or above the interface and optionally a gate electrode G7d below the channel forming region or below the interface. In one exemplary embodiment, all the gate electrodes G7a to G7d are electrically conductively connected to one another. In another exemplary embodiment, all the gate electrodes G7a to G7d are electrically insulated from one another, thereby opening up particular applications.

Particularly in the case of a tunnel FET T7 having a channel forming region, it is also possible for a plurality of gate electrodes G7c and G7d to be arranged along the channel, one gate electrode G7c influencing the tunnel junction and the other gate electrode G7d influencing only the formation of the channel but not the tunnel junction. This also gives rise to new applications, for example for logic basic circuits such as OR, AND and NOR or NAND circuits. Analog signal mixing circuits can also be realized in a simple manner with the aid of the transistor T7.

All of the variants explained with reference to FIG. 4 can also be embodied with opposite doping types at the drain D7 and source S7. The channel forming region of the transistor T7 is either intrinsically conducting or weakly doped.

In the case of the transistor T7 explained with reference to FIG. 4, the gate thickness can be increased in comparison with other transistors of the circuit arrangement 158. However, this is not mandatory since other particular technical effects also result, in particular with regard to the overlap capacitances, with regard to the switch-on current, etc.

Applications for the transistors T1 and T2, T3 and T4 or T5 and T6, and also T7, are explained in more detail below with reference to FIGS. 5 to 7.

FIG. 5 shows a circuit diagram of an inverter circuit 200. The inverter circuit 200 contains a p channel FET T200, the source region S of which is doped in accordance with the same doping type as the drain region D of the FET T200, namely in accordance with the p doping type. Moreover, the inverter circuit 200 contains an n channel tunnel FET T202, the drain region D of which is doped in accordance with a different doping type than the source region of the FET T202; by way of example, the drain region D is n doped and the source region S is p doped. The transistor T200 is constructed e.g. like the transistor T2, T4 or T6, while the transistor T202 is constructed like the transistor T1, T3 or T5. The operating paths of the transistors T200 and T202 are in turn connected in series. The source region S of the FET T200 is at a positive potential V1 or VDD. The drain regions D of the transistors T200 and T202 are electrically conductively connected to one another and to an output line 212 of the inverter circuit 200. The source region S of the FET T202 is connected to a ground potential V2 or VSS. The gate electrodes G of the FETs T200 and T202 are electrically conductively connected to one another and to an input line 210 of the inverter circuit 200.

The inverter circuit 200 explained with reference to FIG. 5 is a so-called push-pull inverter circuit. The method of operation of these circuits is not changed by the use of the tunnel FET T202. However, the leakage current of the transistor T202 falls on account of the thicker gate dielectric in comparison with the transistor T200 given comparable other electrical properties of the two transistors.

In another exemplary embodiment, the transistor T202 is embodied as a tunnel FET. The tunnel FETs afford the advantage that the leakage current falls, with the result that the current consumption of the integrated circuit arrangement is reduced. Moreover, the tunnel FETs afford a simple possibility for realizing a space-saving contact-connection to the channel forming region possibly present. In the exemplary embodiment explained with reference to FIG. 5, too, the tunnel FET T202 has a larger equivalent silicon dioxide thickness in comparison with the transistor T200.

In a further exemplary embodiment two inverters 200 are connected up to form a transfer gate.

FIG. 6 shows a circuit diagram of a NAND circuit 300, which contains an inverter comprising an n-channel transistor T301 and comprising a p-channel transistor T302 and also an inverter comprising an n-channel transistor T303 and comprising a p-channel transistor T304. The inverter comprising the transistors T301 and T302 is connected to an input connection A. The inverter comprising the transistor T303 and the transistor T304 is connected to an input connection B. The circuit 300 has an output line Z. The circuit diagram of the NAND circuit 300 is known. However, in the circuit arrangement 300, in contrast to known circuit arrangements, the transistor T303, that is to say the n-channel transistor connected to the ground potential VSS on the source side, is embodied as a tunnel FET having a larger dielectric thickness in comparison with the other transistors T301, T302 and T304. By way of example, the transistor T303 is constructed like the transistor T1, the transistors T301, T302 and T304 being constructed like the transistor T2. As an alternative, the transistor T303 is constructed like the transistor T3 or T5, while the other transistors of the inverter 300 are constructed like the transistor T4 or T6. The transistors T301, T302 and T304 are not tunnel FETs. In another exemplary embodiment, the transistors T302 and T304 are also formed as tunnel FETs having a larger gate thickness than the transistor T301, which is not a tunnel FET. This means that all the transistors T302, T303 and T304 lying directly on operating voltage lines are embodied as tunnel FETs having a thickened gate dielectric and a current-saving mode of operation results.

FIG. 7 shows a circuit diagram of an SRAM memory unit 400. The construction of the memory unit is known in principle. Thus, the memory unit contains a multiplicity of memory cells 402 which are all constructed identically and extend in a bit line direction, see dots 404, and which also extend in a word line direction, see memory cells 406. Consequently, the memory cells 402, 404 and 406 form a matrix of memory cells. A bit line decoder 408 serves for decoding a binary address datum onto a bit line pair BL1 to BLm with associated inverse bit lines BLB1 to BLBm. A word line decoder 410 serves for decoding a binary address datum onto a word line WL1 to WLn.

Moreover, the memory unit also contains a sensor circuit arrangement 412, which is also referred to as sense amplifier, and which is connected to the bit lines BL1 to BLm and BLB1 to BLBm. The sensor circuit 412 contains e.g. a multiplicity of flip-flops or so-called latches, with the aid of which the signal state on a bit line pair BL1, BLB1 can be reliably detected.

In contrast to known circuit arrangements, however, the memory cells 402 to 406 are in each case produced from six tunnel transistors T400 to T410 having e.g. the same construction as the transistor T1, T3 or T5. The transistors T400 and T402 form a first inverter, which is cross-connected up to an inverter comprising the transistors T404 and T406 in a known manner, such that a flip-flop or a latch results. Gate electrodes of the transistors T408 and T410 are connected to the same word line, to the word line WLn in the exemplary embodiment, where n is a natural number for designating the respective word line.

The FETs in the bit line decoder 408, in the word line decoder 410 and in the sensor circuit 412 are not tunnel FETs, however, and have a thinner gate dielectric than the tunnel transistors T400 to T410 of the memory cells 402, 404 and 406. By way of example, the peripheral transistors are constructed like the transistor T2, T4 or T6. On account of the use of tunnel FETs having a comparatively large gate dielectric thickness, the current consumption of the memory unit 400 is considerably reduced in comparison with known memory arrangements.

The transistor T7 is used in other exemplary embodiments, for example in place of the NAND circuit 300.

To summarize, it holds true that transistor structures are proposed which exhibit, inter alia, a combination of tunnel FET components with multiple gate structures. These structures overcome physical limits of standard FETs and of standard FinFETs or of so-called bulk tunnel FETs. Some of the structures proposed are quasi-vertical, that is to say that the component, in particular the channel forming region or the interface, is arranged in a projection of a substrate, but the current flows parallel to a surface of the substrate or in the lateral direction.

What is claimed is:

1. A semiconductor device comprising:
   a first doped region of a first doping type disposed in a semiconductor body;
   a first extension region of the first doping type disposed in the semiconductor body abutting the first doped region;
   a second doped region of a second doping type disposed in the semiconductor body;
   a first intrinsic region disposed between the first doped region and the second doped region;
   a first gate dielectric layer disposed over the semiconductor body;
   a first control region disposed over the first gate dielectric layer, wherein the first control region overlaps with the first extension region and the first intrinsic region, wherein the first doped region, the first extension region, the second doped region, the intrinsic region, the first gate dielectric layer and the first control region are part of a tunnel transistor; and
   a field effect transistor disposed in and/or over the semiconductor body, the field effect transistor comprising a second gate dielectric layer, wherein the second gate dielectric layer is thicker than the first gate dielectric layer, wherein the tunnel transistor and the field effect transistor form an inverter circuit.

2. The device of claim 1, wherein the tunnel transistor is a planar transistor.

3. The device of claim 1, wherein the tunnel transistor is a fin field effect transistor (FINFET) comprising a fin.

4. The device of claim 1, further comprising:
   a third doped region of the first doping type disposed in the semiconductor body;
   a second extension region of the first doping type disposed in the semiconductor body, wherein the second extension region abuts the third doped region;
   a fourth doped region of the first doping type disposed in the semiconductor body;
   a third extension region of the first doping type disposed in the semiconductor body;

a first channel region of the second doping type disposed between the third doped region and a fourth doped region,
wherein the second gate dielectric layer is disposed over the first channel region; and
a second control region disposed over the second gate dielectric layer.

5. The device of claim 1, wherein the first gate dielectric layer has an equivalent silicon dioxide thickness that is at least 50 percent greater than the equivalent silicon dioxide thickness of the second gate dielectric layer.

6. A semiconductor device comprising
a tunnel field effect transistor disposed in and/or over a substrate, the tunnel field effect transistor comprising a first gate dielectric layer of a first equivalent silicon dioxide thickness; and
a field effect transistor disposed in and/or over the substrate, the field effect transistor comprising a second gate dielectric layer of a second equivalent silicon dioxide thickness, wherein the first equivalent silicon dioxide thickness is greater than the second equivalent silicon dioxide thickness, wherein the tunnel field effect transistor comprises a drain region of a first doping type coupled to a drain region of the field effect transistor having a second doping type opposite to the first doping type, and wherein the tunnel field effect transistor and the field effect transistor are part of an inverter circuit.

7. The device of claim 6, wherein the tunnel field effect transistor comprises:
a first doped region of a first doping type disposed in a semiconductor body;
a first extension region of the first doping type disposed in the semiconductor body abutting the first doped region;
a second doped region of a second doping type disposed in the semiconductor body;
a first intrinsic region disposed between the first doped region and the second doped region,
wherein the first gate dielectric layer is disposed over the semiconductor body; and
a first control region disposed over the first gate dielectric layer, wherein the first control region overlaps with the first extension region and the first intrinsic region, wherein the first doped region, the first extension region, the second doped region, the intrinsic region, the first gate dielectric layer and the first control region are part of a tunnel transistor.

8. The device of claim 6, wherein the tunnel field effect transistor comprises:
a first doped region of a first doping type disposed in a semiconductor body;
a second doped region of a second doping type disposed in the semiconductor body, the second doped region contacting the first doped region to form a p/n junction;
a first gate dielectric layer disposed over the semiconductor body; and
a first control region disposed over the first gate dielectric layer, wherein the first control region overlaps with the p/n junction, wherein the first doped region, the second doped region, the first gate dielectric layer and the first control region are part of a tunnel transistor.

9. The device of claim 6, wherein the tunnel field effect transistor comprises a fin comprising a first doped region of a first doping type and a second doped region of a second doping type.

10. The device of claim 9, further comprising an intrinsic region separating the first doped region from the second doped region.

11. The device of claim 9, wherein the first doped region contacts the second doped region to form a p/n junction.

12. The device of claim 9, further comprising a second control region disposed along a first sidewall of the fin, wherein a first control region is disposed over a top surface of the fin, a third control region disposed along a second sidewall of the fin.

13. A semiconductor device comprising
a tunnel field effect transistor disposed in and/or over a substrate; and
a field effect transistor disposed in and/or over the substrate adjacent the tunnel field effect transistor, wherein the tunnel field effect transistor comprises a drain region of a first doping type coupled to a drain region of the field effect transistor having a second doping type opposite to the first doping type.

14. The device of claim 13, wherein the tunnel field effect transistor comprises:
a first doped region of a first doping type disposed in a semiconductor body;
a first extension region of the first doping type disposed in the semiconductor body abutting the first doped region;
a second doped region of a second doping type disposed in the semiconductor body;
a first intrinsic region disposed between the first doped region and the second doped region;
a first gate dielectric layer disposed over the semiconductor body; and
a first control region disposed over the first gate dielectric layer, wherein the first control region overlaps with the first extension region and the first intrinsic region, wherein the first doped region, the first extension region, the second doped region, the intrinsic region, the first gate dielectric layer and the first control region are part of the tunnel transistor.

15. The device of claim 13, wherein the tunnel field effect transistor comprises:
a first doped region of a first doping type disposed in a semiconductor body;
a second doped region of a second doping type disposed in the semiconductor body, the second doped region contacting the first doped region to form a p/n junction;
a first gate dielectric layer disposed over the semiconductor body; and
a first control region disposed over the first gate dielectric layer, wherein the first control region overlaps with the p/n junction, wherein the first doped region, the second doped region, the first gate dielectric layer and the first control region are part of the tunnel transistor.

16. The device of claim 13, wherein the tunnel field effect transistor comprises a fin comprising a first doped region of a first doping type and a second doped region of a second doping type.

17. The device of claim 16, further comprising an intrinsic region separating the first doped region from the second doped region.

18. The device of claim 16, wherein the first doped region contacts the second doped region to form a p/n junction.

19. The device of claim 16, further comprising a second control region disposed along a first sidewall of the fin, wherein the first control region is disposed over a top surface of the fin, a third control region disposed along a second sidewall of the fin.

20. The device of claim 13, wherein the tunnel field effect transistor and the field effect transistor are part of an inverter circuit.

* * * * *